United States Patent
Pokharna et al.

(10) Patent No.: US 6,596,343 B1
(45) Date of Patent: Jul. 22, 2003

(54) METHOD AND APPARATUS FOR PROCESSING SEMICONDUCTOR SUBSTRATES WITH HYDROXYL RADICALS

(75) Inventors: Himanshu Pokharna, Santa Clara, CA (US); Shankar Chandran, Milpitas, CA (US); Srinivas D. Nemani, San Jose, CA (US); Chen-an Chen, Milpitas, CA (US); Francimar Campana, Milpitas, CA (US); Ellie Yieh, Milbrae, CA (US); Li-Qun Xia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/557,079

(22) Filed: Apr. 21, 2000

(51) Int. Cl.[7] ................................................ C23C 16/00
(52) U.S. Cl. ...................... 427/248.1; 427/586; 427/588
(58) Field of Search ........................ 427/255.28, 255.29, 427/255.31, 255.37, 248.1, 586, 588

(56) References Cited

U.S. PATENT DOCUMENTS

| | | | |
|---|---|---|---|
| 5,710,079 A | * | 1/1998 | Sukharev .................... 427/587 |
| 5,786,039 A | * | 7/1998 | Brouquet .................... 427/578 |
| 6,030,460 A | * | 2/2000 | Sukharev .................... 118/722 |
| 6,413,583 B1 | * | 7/2002 | Moghadam et al. ... 427/249.15 |
| 6,461,692 B2 | * | 10/2002 | Fujii et al. .................. 427/582 |

OTHER PUBLICATIONS

Paul T. Buckley, et al., "Evaluation of Visible–Light Photolysis of Ozone–Water Cluster Molecules as a Source of Atmospheric Hydroxyl Radical and Hydrogen Peroxide", Atmospheric Environment, 1995, pp. 2409–2415, vol. 29, No. 18.

* cited by examiner

Primary Examiner—Bret Chen
(74) Attorney, Agent, or Firm—Townsend and Townsend and Crew

(57) ABSTRACT

A method for processing semiconductor substrates by reacting hydroxyl radicals with a precursor to cause the precursor to decompose and form a film which deposits on a substrate. Hydroxyl radicals, which are produced in a hydroxyl-ion producing apparatus outside of a chemical vapor deposition reactor, are mixed with a precursor to form a hydroxyl ions-precursor mixture. The hydroxyl ions-precursor mixture is introduced into the chemical vapor deposition reactor.

20 Claims, 2 Drawing Sheets

METHOD AND APPARATUS FOR PROCESSING SEMICONDUCTOR SUBSTRATES WITH HYDROXYL RADICALS

BACKGROUND OF THE INVENTION

1. Field of Invention

The present invention relates generally to improved methods and apparatuses for depositing films on partially fabricated integrated circuits (ICs). More specifically, the present invention relates to improved methods and apparatuses for accelerating the deposition of certain materials from precursors, such as organometallic compounds.

2. Description of the Prior Art

In integrated circuit fabrication, various materials are deposited on a substrate at various stages in the fabrication process. By way of example, metallization layers may be produced by processing (e.g., etching, chemical or physical vapor deposition, etc.) layers (e.g., metal layers) on a silicon wafer or substrate. By further way of example, dielectric layers may be formed between metallization layers to enable the formation of multi-level connections to devices, to produce field oxide regions used to isolate semiconductor active devices, to produce passivation layers used to protect entire IC chips during packaging, and to form masks used in subsequent etching processes.

There are many well-known techniques used for depositing materials, such as silicon dioxide ($SiO_2$). Such techniques often include the use of a precursor (e.g., organometallic compounds) reactants, such as tetraethylorthosilicate "TEOS" $Si(OC_2H_5)_4$. Such materials are introduced into a chemical vapor deposition (CVD) reactor chamber to break down and decompose to form films and by-products, such as $SiO_2$ films and Si and organic by-products. TEOS is in a liquid state at room temperatures and must be heated in an external vaporizing apparatus, or otherwise converted to the gas phase, before being introduced into a CVD reactor chamber.

Although forming films from such precursors as TEOS is popular because generally good step coverage is provided and the required deposition temperatures are relatively low, precursors including TEOS are very expensive. Therefore, there is a need to utilize a high percentage of precursors in producing films (as opposed to being pumped out of the CVD reaction chamber as unused reactant).

At least three chemical vapor deposition processes are now commonly used in industry. These include plasma enhanced chemical vapor deposition (PECVD), low pressure chemical vapor deposition (LPCVD), and atmospheric pressure chemical vapor deposition (APCVD). To formulate a $SiO_2$ layer in any of these three chemical vapor deposition processes, oxygen and ozone are typically employed, especially if TEOS is the precursor. While the introduction of oxygen and ozone promotes TEOS decomposition, it has been found that TEOS decomposition reaction is still slow and a relatively high fraction of the TEOS introduced into a CVD chamber does not completely and fully react with the oxygen and ozone and is therefore wasted. Also, because TEOS decomposes at a slow rate, it has been found that the slow rate of decomposition causes certain structural defects (e.g., voids) resulting from the deposition of TEOS $SiO_2$ films over gaps between vertical structures.

U.S. Pat. No. 5,710,079 to Sukharev attempts to solve these problems by providing a method and apparatus for facilitating the decomposition of organometallic compounds in chemical vapor deposition reactors in order to deposit films. In one embodiment for the method in U.S. Pat. No. 5,710,079, the method generally includes: (1) introducing an organometallic compound (e.g., TEOS) and ozone molecules to a chemical vapor deposition reactor; (2) directing ultraviolet radiation into the chemical vapor deposition reactor to increase the rate at which oxygen atoms are formed from the ozone molecules present in the chemical vapor deposition reactor; and (3) decomposing the organometallic compound to form a deposition layer (e.g., a silicon dioxide layer). The organometallic compound is taught as decomposing at an accelerated rate due in part to an increased concentration of hydroxyl radicals present in the chemical vapor deposition reactor. The hydroxyl radicals are produced from a reaction of oxygen atoms with moisture. The water vapor and/or hydrogen peroxide is introduced to the chemical vapor deposition reactor to ensure that a high concentration of hydroxyl radicals are present.

In one embodiment for the apparatus in U.S. Pat. No. 5,710,079, an apparatus for depositing a dielectric layer on a substrate is disclosed. The apparatus is preferably suited for decomposing organometallic compounds such as TEOS with the aid of hydroxyl radicals. The apparatus generally includes: (1) a chemical vapor deposition reactor having a support for a substrate, and at least one inlet port for receiving gases; (2) a source of ozone gas coupled to the at least one inlet port; (3) a source of the organometallic compound coupled to the at least one inlet port; and (4) a source of ultraviolet radiation oriented to direct ultraviolet radiation into the chemical vapor deposition reactor.

The deficiencies with the method and apparatus disclosed in U.S. Pat. No. 5,710,079 is that the CVD reactor chamber must be adapted to produce hydroxyl radicals in situ before the hydroxyl radicals commence to react with and decompose the organometallic compounds. This delays the formation of $SiO_2$ films and causes inefficiencies. Also, the CVD reactor chamber must be built with a radiation transmission window such that ultraviolet light may be transmitted into the CVD reactor chamber in order to decompose ozone molecules to produce atomic oxygen which reacts with water to produce the hydroxyl radicals.

Therefore, what is needed and what has been invented is an improved method and apparatus for processing semiconductor substrates without the foregoing deficiencies and which includes depositing films on partially fabricated integrated circuits. What is further needed and what has been invented is an improved method and apparatus for forming a deposition layer, such as a $SiO_2$ film, in a chemical vapor deposition reactor.

SUMMARY OF THE INVENTION

The present invention broadly provides a method for depositing a layer on a substrate in a chemical vapor deposition reaction zone comprising introducing a precursor into a chemical vapor deposition reaction zone containing a substrate, and introducing hydroxyl radicals into the chemical vapor deposition reaction zone for reacting with the precursor to form a deposition layer on the substrate. The precursor may be selected from the group consisting of silane, silicon, an organometallic compound, and a silicon-containing gas. The introduction of hydroxyl radicals into the chemical vapor deposition reaction zone comprises introducing hydroxyl radicals as a gas phase into the chemical vapor deposition zone. The gas phase preferably comprises at least about 10% by volume of the hydroxyl radicals, and the temperature of the gas phase preferably ranges from about 100° C. to about 150° C. An inert gas is typically employed as a carrier for the precursor. The inert gas may be any suitable inert gas, but is preferably selected from the group consisting of nitrogen, helium, argon, neon, krypton, xenon and radon, and mixtures thereof. The method for depositing a layer additionally comprises producing the hydroxyl radicals prior to the introducing hydroxyl radicals into the chemical vapor deposition reaction zone. Preferably hydroxyl radicals are introduced at a pressure ranging from about 100 Torr to about 200 Torr. Reacting the precursor with the hydroxyl radicals preferably decomposes the precursor to form the deposition layer.

The present invention further broadly provides a method for forming a deposition layer in a chemical vapor deposition reactor comprising the steps of (a) producing hydroxyl radicals; (b) admixing the produced hydroxyl radicals with a precursor to produce a hydroxyl radicals-precursor mixture; and (c) introducing the hydroxyl radicals-precursor mixture of step (b) into the chemical vapor deposition reactor to form a deposition layer. The producing of hydroxyl radicals in step (a) preferably comprises introducing a water-containing agent (e.g., water) and ozone into a hydroxyl radical-producing reactor; and directing ultraviolet radiation into the hydroxyl radical-producing reactor to cause oxygen atoms to form from the ozone and react with the water-containing agent to produce hydroxyl radicals. The method additional comprises removing, prior to the admixing of step (b), hydroxyl radicals from the hydroxyl radical-producing reactor. The admixing of hydroxyl radicals with the precursor causes the hydroxyl radicals to react with the precursor. Preferably, the hydroxyl radicals and the precursor are reacting as the hydroxyl radicals-precursor mixture is being introduced into the chemical vapor deposition reactor.

The present invention also broadly provides a chemical vapor deposition reactor for forming deposition films comprising a chemical vapor deposition reactor chamber; a source of hydroxyl ion gas coupled to the chemical vapor deposition reactor chamber and including hydroxyl ion gas flowing or introducing into the chemical vapor deposition reactor chamber; and a pedestal disposed in the reactor chamber for supporting substrates in the reactor chamber. The chemical vapor deposition reactor also comprises a processing power source; a processing gas-introducing assembly engaged to the reactor chamber for introducing a processing gas into said reactor chamber; and a processing power-transmitting member disposed in proximity to the reactor chamber and connected to the processing power source for transmitting power into the reactor interior for forming deposition films. The source of hydroxyl ion gas comprises a hydroxyl-ion producing reactor having at least one inlet port; a source of water coupled to the at least one inlet port; a source of ozone gas also coupled to the at least one inlet port; and a source of ultraviolet radiation oriented to direct ultraviolet radiation into the hydroxyl-ion producing reactor.

The present invention further also broadly provides a chamber assembly for decomposing a precursor with hydroxyl radicals comprising a process chamber having a support for a substrate and at least one port for receiving at least one gas; a source of precursor gas coupled to the at least one port for flowing precursor gas into the processing chamber; a source of hydroxyl radical gas coupled to the at least one port for flowing or introducing hydroxyl radical gas into the processing chamber to cause the precursor gas to decompose. Further provided in accordance with the present invention is a reactor for processing substrates comprising a reactor chamber; a hydroxyl-ion producing assembly coupled to the reactor chamber for producing hydroxyl ions and introducing the hydroxyl ions into the reactor chamber; and a pedestal disposed in the reactor chamber for supporting substrates in the reactor chamber. The reactor also comprises a processing power source; a processing gas-introducing assembly engaged to the reactor chamber for introducing a processing gas into the reactor chamber; and a processing power-transmitting member disposed in proximity to the reactor chamber and connected to the processing power source for transmitting power into the reactor interior.

These provisions, together with the various ancillary provisions and features which will become apparent to those skilled in the art as the following description proceeds, are attained by these novel apparatuses and methods, a preferred embodiment thereof shown with reference to the accompanying drawings, by way of example only, wherein:

DETAILED DESCRIPTION OF THE PREFERRED EMBODIMENTS

Figure 1:
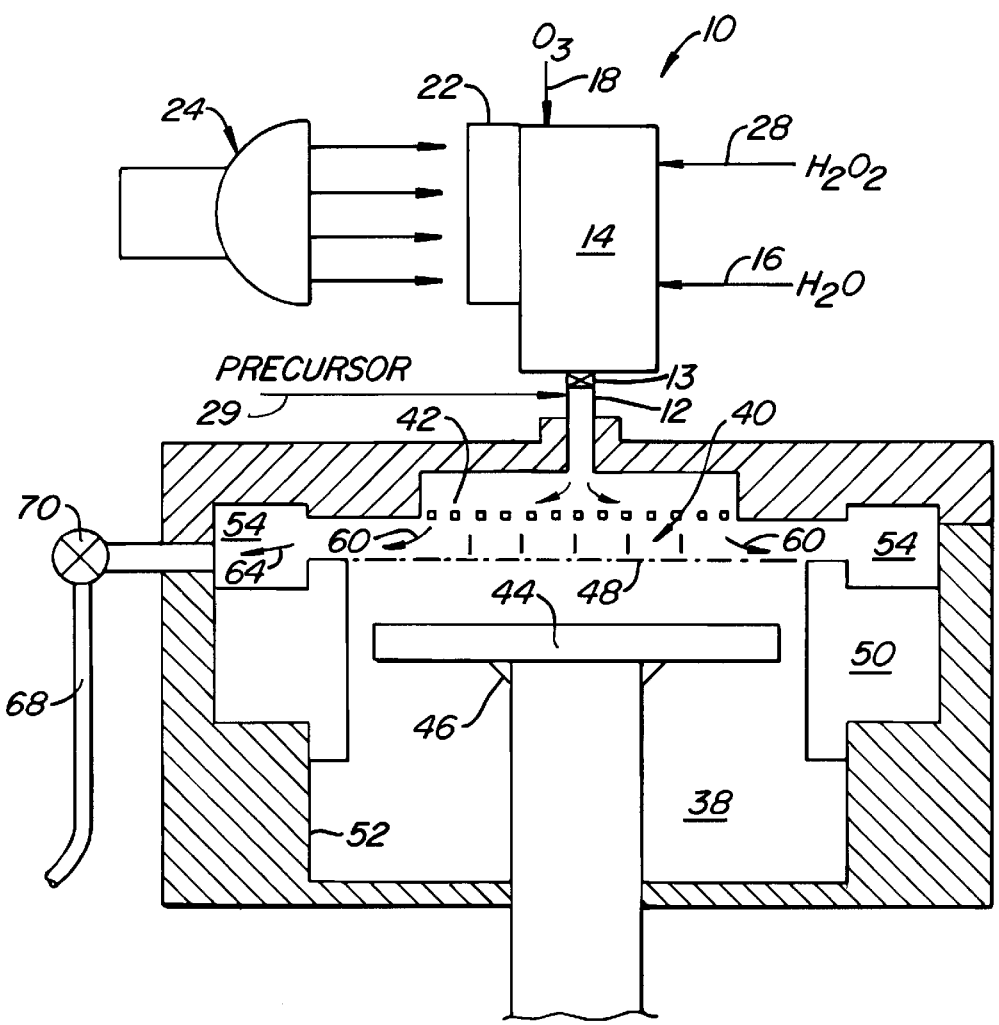
FIG. 1 is a diagrammatic illustration of one embodiment of the invention wherein an hydroxyl ions producing apparatus is in communication with a chemical vapor deposition reaction chamber such that produced hydroxyl radicals may be mixed with a precursor prior to being introduced into the chemical vapor deposition reaction chamber.

Embodiments of the present invention provide for methods and apparatuses for depositing one or more layers of one or more materials on the surface(s) of semiconductor substrates or devices. The deposited layers are formed from decomposing in a reactor a suitable precursor, such as an organometallic compound or an organometalloid. The reactor may be any suitable reactor, but is preferably a chemical vapor deposition (CVD) reactor. The one or more materials that are deposited on the semiconductor substrate may be any material or matter that can be produced under appropriate conditions by decomposing, or otherwise breaking down, a precursor with the assistance of hydroxyl radicals or ions, which react with the precursor to cause the decomposition of same. The one or more materials include, but are not limited to, semiconductors, dielectrics, and metals employed in manufacturing integrated circuits and other semiconductor devices.

For purposes of illustrating various preferred embodiments of the present invention, the precursor will be TEOS, tetraethylorthosilicate $Si(OC_2H_5)_4$, as a suitable organometallic compound which, when coming in contact with hydroxyl radicals, decomposes or breaks down into $SiO_2$, the material which deposits and/or forms as a deposited material or layer on a semiconductor substrate. TEOS is employed in the gaseous state; thus, a suitable heater (not shown) heats the TEOS at a suitable temperature, such as a temperature ranging from about 20° C. to about 100° C., to change liquid TEOS into vapor or gaseous TEOS. While TEOS will be, used as the precursor to illustrate preferred embodiments of the present invention, it is to be understood that the spirit and scope of the present invention include other precursors such as, by way of illustration only, trimethylsilane (TMS), BPTEOS, TEB, TMOP, OMCTS, HMDS, TMCTS, TRIES, etc. These precursors, as well as others which are all within the spirit and scope of the present invention, may be employed to deposit and/or form on a semiconductor substrate films or layers of such materials as titanium (Ti), tantalum (Ta), tungsten (W), silicides, and so forth. Obviously, the type and chemical composition of the material deposited and/or formed on the semiconductor substrate depends on the chemical composition of the precursor. Thus, the material deposited is dictated by the precursor selected. As was previously indicated, if $SiO_2$ is to be the deposited material, then TEOS would be an acceptable precursor for being decomposed by reacting with hydroxyl radicals.

It is to be also understood that while the processing of the semiconductor substrate will be in a CVD reactor for purposes of illustrating embodiments of the present invention, the spirit and scope of the present invention would include other types of reactors and other forms of processing substrates, such as by way of example only, plasma processing, physical vapor deposition, etc. Other types of reactors within the spirit and scope of the present invention include inductively coupled plasma reactors, such as those disclosed in U.S. Pat. No. 5,753,044, assigned to assignee of the present invention and fully incorporated herein by reference thereto as if repeated verbatim immediately hereafter. An inductively coupled plasma has a plasma ion density greater than about $10^9/cm^3$, preferably greater than about $10^{11}/cm^3$. During plasma processing, processing power (e.g., RF power, magnetron power, microwave power, etc.) passes through a dielectric member, which includes a dielectric window of a nonconductive material such as a ceramic dome, etc., and becomes coupled to a plasma of the processing gas. If the plasma process is plasma depositing, metals (e.g., platinum, copper, aluminum, titanium, ruthenium, iridium, etc.), as well as other materials such as dielectrics, may be respectively deposited on a substrate. Thus, the spirit and scope of the present invention would include any type of processing of a semiconductor substrate and any type reactor or reaction zone for processing a semiconductor substrate, all readily discernible to those possessing the ordinary skill in the art.

In accordance with an embodiment of the present invention, the precursor and hydroxyl radicals or ions are introduced into a CVD reactor, preferably in a gaseous state. The precursor and hydroxyl radicals may be admixed before being introduced into the CVD reactor; or alternatively, the precursor and the hydroxyl radicals may be independently introduced into the CVD reactor and then admixed within the CVD reactor itself. When the hydroxyl radicals come in contact with the precursor (e.g., a processing gas), the hydroxyl radicals react with and/or cause decomposition of the precursor, resulting in the deposition rate of the depositing material accelerating, especially since the concentration of the hydroxyl radicals is instantly increased within the CVD reactor because hydroxyl radicals are being introduced into the CVD reactor in a pure, free state. Hydroxyl radicals also cause acceleration of the decomposition or break down of the precursor. It is believed that by initially producing the hydroxyl radicals outside of a CVD reactor, instead of producing the hydroxyl radicals within a CVD reactor as disclosed in U.S. Pat. No. 5,710,079, and subsequently introducing the hydroxyl radicals into the CVD reactor, the reaction and/or decomposition of the precursor is faster than if the hydroxyl radicals had been produced within the CVD reactor as disclosed in U.S. Pat. No. 5,710,079. It is also believed that the same would hold true with respect to accelerating the deposition rate of depositing material. Thus, the fact that hydroxyl radicals are already formed when introduced into the CVD reactor enables the precursor within the reactor chamber to immediately come in contact with and react with the hydroxyl radicals as opposed to the precursor waiting in the CVD reactor for the hydroxyl radicals to initially form (as disclosed in U.S. Pat. No. 5,710,079) and then subsequently commencing a reaction with the hydroxyl radicals for decomposing the precursor to produce material that deposits on the semiconductor substrate. In the embodiment where the hydroxyl radicals and the precursor are mixed together before passing into the CVD reactor, the reaction of the precursor with the hydroxyl radicals immediately commences. Thus, reaction of the precursor with the hydroxyl radicals, and decomposition of the precursor, are all taking place as the precursor and the hydroxyl radicals are passing into the CVD reactor. When the precursor is an organometallic compound, the hydroxyl radicals also combine with carbon atoms originating from the organometallic precursor, thus reducing carbon contamination within the CVD reactor.

In a preferred embodiment of the invention, hydroxyl radicals or ions are produced, obtained, or otherwise provided. The hydroxyl radicals or ions may be produced, obtained, or otherwise provided in any suitable manner, all of which would fall within the spirit and scope of the present invention. Preferably, the hydroxyl radicals are produced in a suitable hydroxyl-ion producing reactor or assembly to provide a source of hydroxyl radicals. Water ($H_2O$) and/or steam and ozone ($O_3$) are respectively introduced into a suitable hydroxyl-ion producing reactor. Subsequently, ultra-violet radiation is introduced into or provided to the reactor to cause the ozone to decompose into oxygen and atomic oxygen (O*) in $^1D$ state which reacts with the water molecules to generate hydroxyl radicals ($OH^-$) in a gasphase. Typically, unreacted water (or unreacted steam), oxygen and some ozone are also in the reactor. Alternatively, or in addition to, hydrogen peroxide ($H_2O_2$), preferably gaseous hydrogen peroxide, may be introduced into the hydroxyl-ion producing reactor where ultra-violet radiation photolyzes and/or decomposes the hydrogen peroxide into an independent or an additional gas-phase source of hydroxyl radicals. The hydroxyl-ion producing reactor would be equipped with a suitable transmission window for receiving and allowing passage of ultraviolet rays into the hydroxyl-ion producing reactor from an external source, such as a mercury arc lamp. After the hydroxyl-radicals have been produced, they, along with unreacted water (or unreacted steam), oxygen and traces of ozone, flow and are introduced into a reactor which is being simultaneously supplied with gaseous TEOS, preferably with the aid of a noble or inert gas such as nitrogen, argon, helium, neon, krypton, xenon, radon, and mixtures thereof. The gaseous hydroxyl radicals contact and react with the gaseous TEOS such that the TEOS decomposes and breaks down to various components, one of which is $SiO_2$ that deposits on a semiconductor substrate. As previously indicated and for one embodiment of the invention, gaseous hydroxyl radicals and gaseous TEOS (i.e., a precursor) are mixed together immediately before they enter the CVD reactor. This causes the hydroxyl radicals to immediately start reacting with the TEOS outside of the CVD reactor, enabling decomposition of TEOS into $SiO_2$ and other components as TEOS enters the CVD reactor. Also, TEOS and hydroxyl radicals continue to react with each other as they are entering the CVD reactor, causing SiO$_2$ to essentially immediately start depositing on the semiconductor substrate. As further previously indicated and for another embodiment of the invention, gaseous hydroxyl radicals and gaseous TEOS come in contact with each other essentially immediately after entering the CVD reactor, causing in the CVD reactor the essentially immediate hydroxyl ion-TEOS reaction and concomitant TEOS decomposition along with subsequent SiO$_2$ deposition. The formation and deposition of SiO$_2$ may be conducted at any suitable pressure and temperature, such as by way of example only, at atmospheric pressure in a chemical vapor deposition (APCVD) process, or at subatmospheric pressure in a chemical vapor deposition (SACVD) process, all readily known to those possessing ordinary skill in the art.

As previously indicated, the deposition rate of the silicon dioxide film increases due to the accelerated rate at which TEOS is decomposed by the hydroxyl radicals. As also previously indicated above, the increased rate at which TEOS decomposes is generally correlated to the increased amount of hydroxyl radicals (*OH) being produced and coming into contact with the TEOS. When ozone (O$_3$) is exposed to ultraviolet radiation in a hydroxyl-ion producing reactor, the rate at which ozone decomposes to form oxygen (O$_2$) molecules and atomic oxygen (i.e., oxygen radicals "O*") is increased. Because atomic oxygen rapidly reacts with gaseous water present in the hydroxyl-ion producing reactor to produce hydroxyl radicals, an increased concentration of hydroxyl radicals can be produced in the hydroxyl-ion producing reactor. For one embodiment of the invention when free hydroxyl radicals are introduced into the CVD reactor for immediate contact with TEOS, the rate at which TEOS decomposes is beneficially increased, and the rate at which silicon dioxide films are formed is also beneficially increased. For another embodiment of the invention when free hydroxyl radicals are mixed with TEOS immediately before entering the CVD reactor, the rate at which TEOS decomposes and the rate SiO$_2$ deposits are also beneficially increased, especially since TEOS is decomposing as it is entering the CVD reactor. By increasing the rate at which TEOS decomposes into SiO$_2$, a larger percentage of TEOS will actually be consumed and converted into silicon dioxide films as opposed to being removed from the CVD reactor unused. As previously indicated, a reduction in carbon contamination will occur due to the increased amount of hydroxyl radicals reacting with TEOS and being introduced into the CVD reactor. It should be appreciated that less carbon contamination will beneficially generate SiO$_2$ dielectric layers, as well as other layers, with improved reliability.

Referring now to FIG. 1, there is seen a schematic diagram of an exemplary hydrogen-ion producing reactor, generally illustrated as 10, communicating with a CVD apparatus, generally illustrated as 30, through a conduit 12 having a flow control valve 13. In one embodiment of the present invention, water (H$_2$O) and/or steam and ozone (O$_3$) are introduced into reactor chamber 14 through lines 16 and 18, respectively. Reactor chamber 14 is preferably at a pressure ranging from about 2 Torr to about 400 Torr, more preferably from about 80 Torr to about 200 Torr, most preferably from about 100 Torr to about 150 Torr. The reactor chamber 14 is preferably at a temperature ranging from about 50° C. to about 250° C., more preferably from about 100° C. to about 200° C., most preferably from about 150° C. to about 160° C. A radiation transmission window 22 is coupled to reactor chamber 14 such that a suitable radiation source may transmit radiation into reactor chamber 14 in order to enhance the decomposition rate of the injected ozone molecules. By way of example only, radiation transmission window 22 may be a quartz window suitable to transmit ultraviolet radiation into reactor chamber 14. In one embodiment, radiation may be introduced directly from a mercury arc lamp 24 at radiation transmission window 22. It should be appreciated that any suitable radiation source or configuration may be substituted for mercury arc lamp 24. By further way of example only, a radiation source may have a wavelength radiation spectrum containing a wavelength line ranging from about 200 nm to about 300 nm, preferably about a wavelength line containing about 254 nm line corresponding to strong ozone absorption.

After ozone and water have entered reactor chamber 14, mercury arc lamp 24 is activated such that ultraviolet radiation having an approximate wavelength of 254 nm is directed at the ozone/water mixture in the reactor chamber 14. In this manner, the water rich gas phase ozone molecules are caused to decompose and form oxygen molecules and atomic oxygen (O*) in $^1$D state. As described above, since atomic oxygen is highly reactive with water molecules, a high percentage of hydroxyl radicals will be generated. The following are the chemical mechanisms involved in this embodiment of the present invention:

$$O_3 \xrightarrow{UV} O_2 + O^*$$
$$O^* + H_2O \longrightarrow 2OH$$

Stated alternatively, hydroxyl radicals are produced via the ultraviolet photolysis of ozone to produce electronically excited singlet oxygen atoms:

$$O_3 + h\nu(\lambda < 310) \rightarrow O(^1D) + O_2$$

The primary fate of the singlet oxygen atoms is collistional deactivation to the triplet ground state:

$$O_3(^1D) + M \rightarrow O + M$$

where M is the cold reactor wall, as stated in the Kirk-Othmer, *Encyclopedia of Chemical Technology*, Vol. 17, p. 953–994, Fourth Edition published by John Wiley & Sons (New York, 1996), incorporated herein by reference thereto.

The ultraviolet photolysis of O$_3$·H$_2$O clusters also provide a source of hydroxyl radicals and/or hydrogen peroxide:

$$O_3 \cdot H_2O + h\nu \rightarrow 2OH + O_2 \quad \text{(R1)}$$

$$O_3 \cdot H_2O + h\nu \rightarrow H_2O_2 + O_2 \quad \text{(R2)}$$

Reaction 1 (R1) is energetically possible for wavelengths of light shorter than 665 nm, while reaction 2 (R2) is exothermic even without the absorption of light. For the absorption of 600 nm light, the ground state O atoms produced in the ultraviolet photolysis of ozone have up to 22.2 kcal mol$^{-1}$ of translational energy to overcome the activation barriers necessary to abstract a hydrogen atom from water or to insert into the water molecule to form H$_2$O$_2$. Since the O atoms would be produced in the presence of a water molecule, reactions R1 and R2 may be preferential over other reactions, such as combination with O$_2$ to reform ozone. Also, hydrogen peroxide (H$_2$O$_2$) produced by reaction R2 above, or otherwise provided for reactor chamber 14, breaks down or decomposes in the presence of ultraviolet light into hydroxyl ions, and thus may provide an additional gas-phase source of hydroxyl radicals:

$$H_2O_2 + h\nu \rightarrow 2OH$$

Therefore, in another embodiment of the present invention, hydrogen peroxide (preferably gaseous $H_2O_2$) solely, or hydrogen peroxide in combination with ozone and/or water and/or water vapor or steam, is introduced into the reactor chamber 14 via conduit or line 28. As previously indicated, hydrogen peroxide reduces to hydroxyl radicals when contacted by ultraviolet radiation. When a sufficient quantity of hydroxyl radicals has been produced in the reactor chamber 14, valve 13 is opened and hydroxyl radicals in a gas phase flow out of the reactor chamber 14 and into conduit 12. The hydroxyl radical gas phase comprises a temperature ranging from about 80° C. to about 175° C., more preferably from about 100° C. about 150° C. The hydroxyl radical gas phase also comprises a pressure ranging from about 2 Torr to about 400 Torr, preferably from about 50 Torr, to about 250 Torr, more preferably from about 100 Torr to about 150 Torr.

Figure 2:
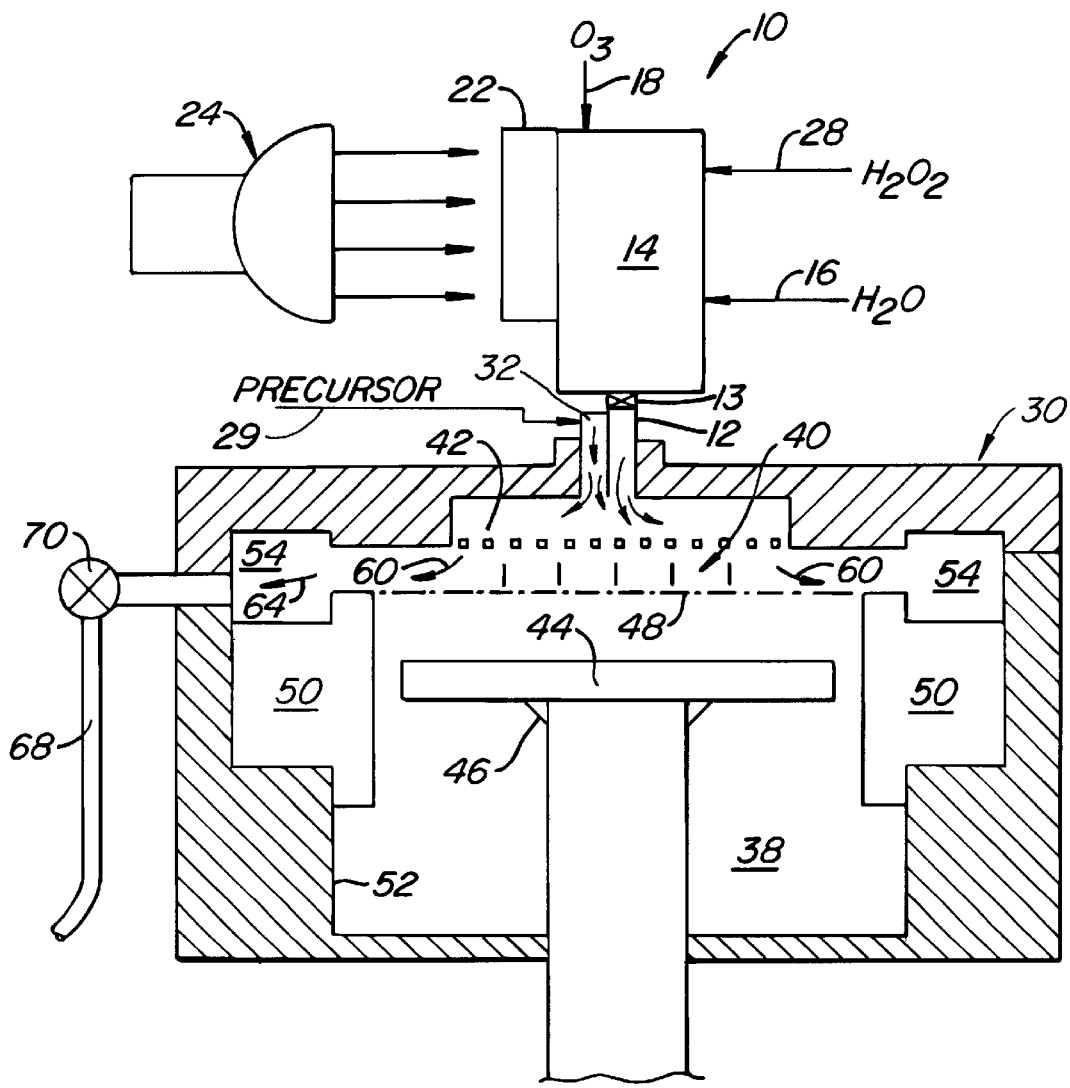
FIG. 2 is a diagrammatic illustration of another embodiment of the invention wherein an hydroxyl ions producing apparatus is in communication with a chemical vapor deposition reaction chamber such that produced hydroxyl ions may be directly introduced into the chemical vapor deposition reaction chamber without being premixed with the precursor.

In one embodiment of the invention as best shown in FIG. 1, a precursor (e.g., TEOS) in a gas phase, along with an inert carrier gas, such as nitrogen, argon and helium (or any other suitable inert carrier gas such as krypton, radon, and xenon), is flowed through conduit 29 and into conduit 12 where the hydroxyl radicals immediately start reacting with the precursor within conduit 12 before the mixture of precursor and hydroxyl radicals (along with inert carrier gas, unreacted water, oxygen and ozone) is introduced into the CVD apparatus 30. As the mixture of precursor and hydroxyl radicals passes into the CVD apparatus 30, the hydroxyl radicals are reacting with the precursor, causing essentially instantaneous decomposition of the precursor as it enters the CVD apparatus 30. In another embodiment of the invention as best illustrated in FIG. 2, the precursor (e.g., TEOS) flows from conduit 29 into a conduit 32 which communicates with the CVD apparatus 30 in order to cause the gaseous precursor to come in contact with the gaseous hydroxyl radicals flowing out of conduit 12 in the CVD apparatus 30 such that the reaction of the precursor and the hydroxyl radicals, as well as decomposition of the precursor, commences immediately within the CVD apparatus 30. In FIG. 2, the produced hydroxyl radicals (along with unreacted water, oxygen and ozone) flow directly into the CVD apparatus 30.

CVD apparatus 30 includes an enclosure assembly 36 housing a vacuum chamber 38 with a gas reaction area 40. A gas distribution plate 42 is provided above the gas reaction area 40 for dispersing reactive gases through perforated holes in plate 42 to a wafer (not shown) that rests on a vertically movable heater 44 (also referred to as wafer support pedestal or susceptor). CVD apparatus 30 further includes a heater/lift assembly 46 for heating the wafer supported on heater 44. Heater/lift assembly 46 also can be controllably moved between a lower loading/off-loading position and an upper processing position indicated by dotted line 48 which is closely adjacent to plate 42, as shown in FIG. 1. A center board (not shown) includes sensors for providing information on the position of the wafer. Heater 44 includes resistively-heated components enclosed in a ceramic, preferably aluminum nitride or anodized aluminum. In an exemplary embodiment, all surfaces of heater 44 exposed to vacuum chamber 38 are made of a ceramic material, such as aluminum oxide ($Al_2O_3$ or alumina) or aluminum nitride. When heater 44 and the wafer are in processing position 48, they are surrounded by a chamber liner 50 along the inside walls 52 of CVD apparatus 30 and by an annular pumping channel 54, formed by chamber liner 56 and a top portion of vacuum chamber 38. The surface of chamber liner 50 preferably comprises a ceramic material, such a alumina or aluminum nitride, which serves to lower the temperature gradient between resistively-heated heater 44 (high temperature) and chamber walls 52, which are at a much lower temperature relative to heater 44.

After gaseous hydroxyl radicals (along with unreacted water/steam, oxygen and ozone) are formed in reactor chamber 14, valve 13 is subsequently opened causing the formed gaseous hydroxyl radicals (along with unreacted water/steam, oxygen and ozone) to either flow directly into the CVD apparatus 30 via conduit 12 as best shown in FIG. 2, or to be admixed within conduit 29 with gaseous TEOS (i.e., the precursor), along with its associated inert carrier gas (e.g., nitrogen or argon), flowing into conduit 12 via conduit 29. The formed gaseous hydroxyl radicals along with unreacted water/steam, oxygen and ozone comprise at least about 10% by volume hydroxyl radicals, preferably from about 10% by volume to about 30% by volume hydroxyl radicals, more preferably from about 15% by volume to about 25% by volume hydroxyl radicals, most preferably from about 17% by volume to about 23% by volume (e.g., about 20% by volume) hydroxyl radicals. Because the hydroxyl radicals have a short half-life (e.g., from about 2 secs. to about 14 secs.), once the hydroxyl radicals are produced in the reactor chamber 14, they are subsequently delivered into the CVD apparatus 30 of FIG. 2 for the embodiment of the invention of FIG. 2, within about 30 secs. after formation, preferably within a time period ranging from about 1 sec. to about 30 secs. after formation, more preferably within a time period ranging from about 2 secs. to about 20 secs. after formation, most preferably within a time period ranging from about 2 secs. to about 8 secs. after formation. For the embodiment of the invention of FIG. 1, the hydroxyl radicals are subsequently delivered into contact with TEOS (i.e., the precursor) within conduit 12 within about 30 secs. after formation, preferably into contact with TEOS within a time period ranging from about 1 sec. to about 30 secs. after formation, more preferably into contact with TEOS within a time period ranging from about 2 secs. to about 12 secs. after formation, most preferably into contact with TEOS within a time period ranging from about 2 secs. to about 8 secs after formation.

The hydroxyl radical gas (along with associated unreacted water/steam, oxygen, and ozone) is flowed out of reactor chamber 14, and gaseous TEOS (along with inert carrier gas) is flowed through conduit 29 at rates such that a stoichiometric amount of hydroxyl radical gas is available to react with TEOS gas. Preferably, when gaseous TEOS (along with inert gas) comes into contact with and mixes with gaseous hydroxyl radicals (along with unreacted water/steam, oxygen and ozone), either in conduit 12 for the embodiment of the invention of FIG. 1 or within the CVD apparatus 30 for the embodiment of the invention of FIG. 2, the resulting mixture comprises, or consists of, or consists essentially of, from about 50% to about 95% by volume TEOS (along with inert gas) and from about 5% by volume to about 50% by volume hydroxyl radicals (along with unreacted water/steam, oxygen and ozone), preferably from about 55% to about 90% by volume TEOS (along with inert gas) and from about 10% to about 45% by volume hydroxyl radicals (along with unreacted water/steam, oxygen and ozone), more preferably from about 60% to about 85% by volume TEOS (along with inert gas) and from about 15% to about 40% by volume hydroxyl radicals (along with unreacted water/steam, oxygen and ozone), most preferably from about 65% to about 80% by volume TEOS (along with inert gas) and from about 20% to about 35% by volume hydroxyl radicals (along with unreacted water/steam, oxygen and ozone).

More specifically, when gaseous TEOS (along with inert gas) comes into contact with and mixes with gaseous hydroxyl radicals (along with unreacted water/steam, oxygen and ozone) either for the embodiment of the invention of FIG. 1 or for the embodiment of the invention of FIG. 2, the resulting mixture comprises, or consists of, or consists essentially of, from about 5% to about 15% by volume TEOS gas, from about 30% to about 50% by volume inert gas, from about 5% to about 15% by volume hydroxyl radical gas, from about 0% to about 20% by volume of a water-containing agent (e.g., water), from about 10% to about 30% by volume oxygen, from about 0% to about 5% by volume ozone; more preferably from about 10% to about 15% by volume TEOS gas, from about 30% to about 40% by volume inert gas, from about 10% to about 15% by volume hydroxyl radical gas, from about 0% to about 10% by volume of a water-containing agent (e.g., water), from about 10% to about 30% by volume oxygen, from about 0% to about 10% by volume ozone; most preferably from about 12% to about 15% by volume TEOS gas, from about 40% to about 45% by volume inert gas, from about 12% to about 15% by volume hydroxyl radical gas, from about 0% to about 8% by volume of a water-containing agent (e.g., water), from about 15% to about 20% by volume oxygen, from about 0% to about 5% by volume ozone.

After gaseous TEOS (along with inert carrier gas) and hydroxyl radicals (along with unreacted water/steam, oxygen and ozone) are mixed together, either for the embodiment of the invention of FIG. 1 or for the embodiment of the invention or of FIG. 2, the mixture is delivered to plate 42. During deposition processing, gas supplied to plate 42 is vented toward the wafer surface (as indicated by arrows 60), where it may be uniformly distributed radially across the wafer surface, typically in a laminar flow. Purging gas may be delivered into vacuum chamber 38 from an inlet port or tube (not shown) through the bottom wall of enclosure assembly 36. The purging gas flows upward past heater 44 and to an annular pumping channel 54. An exhaust system then exhausts the gas (as indicated by arrows 64) into the annular pumping channel 54 and through an exhaust line 68 by a vacuum pump system (not shown). Exhaust gases and residues are preferably released from annular pumping channel 54 through exhaust line 68 at a rate controlled by a throttle valve system 70. As indicated earlier, thermal CVD processes supply reactive gases to the substrate surface where heat-induced chemical reactions (homogeneous or heterogeneous) take place to produce a desired film. In CVD apparatus 30 heat is distributed by resistively-heated heater 44 that is capable of reaching temperatures as high as about 400–800° C. Such heat distribution provides uniform, rapid thermal heating of the wafer for effecting deposition, reflow and/or drive-in, cleaning, and/or seasoning/gettering steps in a multiple-step process in situ in vacuum chamber 38. Alternatively, a controlled plasma may be formed adjacent to the wafer by RF energy applied to gas distribution plate 42 from an RF power supply (not shown). In embodiments additionally having a lower RF electrode, the RF power supply can supply either single frequency RF power to plate 42 or mixed frequency RF power to plate 42 and the lower RF electrode to enhance the decomposition of reactive species introduced into process chamber 38. In a plasma process, some of the components of vapor deposition apparatus 30 would have to be modified to accommodate the RF energy.

Thus, by the practice of an embodiment of the present invention, there is broadly provided a method for depositing a layer on a substrate in a chemical vapor deposition reaction zone comprising introducing a precursor, (e.g. TEOS) into a chemical vapor deposition reaction zone containing a substrate, and introducing hydroxyl radical in a gas phase into the chemical vapor deposition reaction zone for reacting with the precursor to form a deposition layer on the substrate. The hydroxyl radical gas phase preferably comprises at least about 10% by volume hydroxyl radicals, and the temperature of the gas phase preferably ranges from about 100° C. to about 150° C. An inert gas is typically employed as a carrier gas for the precursor. The method for depositing a layer additionally comprises producing the hydroxyl radicals prior to the introducing hydroxyl radicals into the chemical vapor deposition reaction zone. Preferably, hydroxyl radicals are introduced at a pressure ranging from about 100 Torr to about 200 Torr.

By the further practice of an embodiment of the present invention there is further broadly provided a method for forming a deposition layer in a chemical vapor deposition reactor comprising the steps of (a) producing hydroxyl radicals; (b) admixing the produced hydroxyl radicals with a precursor (e.g. a processing gas such as an organometallic processing gas) to produce a hydroxyl radicals-precursor mixture; and (c) introducing the hydroxyl radicals-precursor mixture into the chemical vapor deposition reactor to form a deposition layer. The producing of hydroxyl radicals preferably comprises introducing a water-containing agent (e.g., water) and ozone into a hydroxyl radical-producing reactor; and directing ultraviolet radiation into the hydroxyl radical-producing reactor to cause oxygen atoms to form from the ozone and react with the water-containing agent to produce hydroxyl radicals. The method additional comprises removing, prior to the admixing step (b), hydroxyl radicals from the hydroxyl radical-producing reactor. The admixing of hydroxyl radicals with the precursor causes the hydroxyl radicals to react with the precursor. Preferably, the hydroxyl radicals and the precursor are reacting as the hydroxyl radicals-precursor mixture is being introduced into the chemical vapor deposition reactor.

By the still further practice of an embodiment of the present invention there is also broadly provided, a chemical vapor deposition reactor, including a CVD reactor chamber, for forming deposition films comprising a chemical vapor deposition reactor chamber; and a source of hydroxyl ion gas coupled to the chemical vapor deposition reactor chamber and including hydroxyl ion gas flowing or introducing into the chemical vapor deposition reactor chamber. A pedestal is disposed in the reactor chamber for supporting substrates in the reactor chamber. The chemical vapor deposition reactor also comprises a processing power source; a processing gas-introducing assembly engaged to the reactor chamber for introducing a processing gas into the reactor chamber; and a processing power-transmitting member disposed in proximity to the reactor chamber and connected to the processing power source for transmitting power into the reactor interior for forming deposition films. The source of hydroxyl ion gas comprises a hydroxyl-ion producing reactor having at least one inlet port; a source of water coupled to the at least one inlet port; a source of ozone gas also coupled to the at least one inlet port; and a source of ultraviolet radiation oriented to direct ultraviolet radiation into the hydroxyl-ion producing reactor.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for depositing a layer on a substrate in a chemical vapor deposition reaction zone comprising:

introducing a precursor into a chemical vapor deposition reaction zone containing a substrate; and introducing hydroxyl radicals into the chemical vapor deposition reaction zone for reacting with the precursor to form a deposition layer on the substrate, and wherein the method additionally comprises producing said hydroxyl radicals prior to said introducing hydroxyl radicals into the chemical vapor deposition reaction zone.

2. The method of claim 1 wherein said precursor comprises silane.

3. The method of claim 1 wherein said precursor comprises silicon.

4. The method of claim 1 wherein said precursor comprises an organometallic compound.

5. The method of claim 1 wherein said precursor comprises a silicon-containing gas.

6. The method of claim 1 wherein said introducing hydroxyl radicals into the chemical vapor deposition reaction zone comprises introducing hydroxyl radicals as a gas phase into said chemical vapor deposition zone.

7. The method of claim 6 wherein said gas phase comprises a temperature ranging from about 100° C. to about 150° C.

8. The method of claim 6 wherein said gas phase comprises at least about 10% by volume of said hydroxyl radicals.

9. The method of claim 6 wherein said gas phase consists essentially of at least about 10% by volume of said hydroxyl radicals.

10. The method of claim 6 where said gas phase consists of at least about 10% by volume of said hydroxyl radicals.

11. The method of claim 1 additionally comprising admixing, prior to said introducing the precursor, an inert gas with the precursor for delivering the precursor into the chemical vapor deposition reaction zone.

12. The method of claim 11 wherein said inert gas is selected from the group consisting of nitrogen, helium, argon, neon, krypton, xenon and radon, and mixtures thereof.

13. The method of claim 1 wherein said introducing hydroxyl radicals additional comprises introducing hydroxyl radicals at a pressure ranging from about 100 Torr to about 200 Torr.

14. The method of claim 1 wherein said reacting with said precursor comprises decomposing said precursor to form said deposition layer.

15. A method for forming a deposition layer in a chemical vapor deposition reactor comprising:

a) producing hydroxyl radicals;

b) admixing the produced hydroxyl radicals with a precursor to produce a hydroxyl radicals-precursor mixture; and c) introducing the hydroxyl radicals-precursor mixture of step (b) into the chemical vapor deposition reactor to form a deposition layer, wherein said producing hydroxyl radicals of step (a) comprises introducing a water-containing agent and ozone into a hydroxyl radical-producing reactor, and directing ultraviolet radiation into said hydroxyl radical-producing reactor to cause oxygen atoms to form from the ozone and react with the water-containing agent to produce hydroxyl radicals.

16. The method of claim 15 wherein said admixing of hydroxyl radicals with said precursor causes said hydroxyl radicals to react with said precursor.

17. The method of claim 15 wherein said hydroxyl radicals and said precursor are reacting as said hydroxyl radicals-precursor mixture is being introduced into said chemical vapor deposition reactor.

18. A method for depositing a layer on a substrate, the method comprising:

producing hydroxyl groups in a hydroxyl group producing reactor;

flowing the produced hydroxyl groups from the hydroxyl group producing reactor through a conduit to a chemical vapor deposition reactor containing a semiconductor substrate;

introducing a precursor into the chemical vapor deposition reactor;

reacting the precursor and the hydroxyl groups in the chemical vapor deposition reactor; and forming a layer on the semiconductor substrate.

19. The method of claim 18 wherein the precursor comprises silane.

20. The method of claim 18 further comprising:

introducing water into the hydroxyl group producing reactor.

* * * * *